(12) United States Patent
Uemura et al.

(10) Patent No.: US 6,573,117 B2
(45) Date of Patent: Jun. 3, 2003

(54) GAN RELATED COMPOUND SEMICONDUCTOR AND PROCESS FOR PRODUCING THE SAME

(75) Inventors: Toshiya Uemura, Aichi (JP); Naoki Shibata, Aichi (JP); Shizuyo Noiri, Aichi (JP); Masanori Murakami, Kyoto (JP); Yasuo Koide, Kyoto (JP); Jun Ito, Aichi (JP)

(73) Assignee: Toyoda Gosei Co., Ltd., Aichi (JP)

(*) Notice: Subject to any disclaimer, the term of this patent is extended or adjusted under 35 U.S.C. 154(b) by 0 days.

(21) Appl. No.: 10/053,570

(22) Filed: Jan. 24, 2002

(65) Prior Publication Data

US 2002/0072204 A1 Jun. 13, 2002

Related U.S. Application Data

(60) Continuation of application No. 09/819,622, filed on Mar. 29, 2001, which is a division of application No. 08/979,346, filed on Nov. 26, 1997, now Pat. No. 6,291,840.

(30) Foreign Application Priority Data

Nov. 29, 1996 (JP) .............................. 8-334956
Jan. 17, 1997 (JP) .............................. 9-019748
Feb. 14, 1997 (JP) .............................. 9-047064

(51) Int. Cl.$^7$ .......................... H01L 21/00; H01L 21/28
(52) U.S. Cl. .......................... 438/46; 438/604; 438/796
(58) Field of Search ............................. 438/22, 24, 46, 438/597, 602, 604, 605, 606, 795, 796

(56) References Cited

U.S. PATENT DOCUMENTS

| | | |
|---|---|---|
| 4,701,035 A | 10/1987 | Hirose |
| 5,563,422 A | 10/1996 | Nakamura et al. |
| 5,656,832 A | 8/1997 | Ohiba et al. |
| 5,701,035 A | 12/1997 | Teraguchi |
| 5,740,192 A | 4/1998 | Hatano et al. |
| 5,764,842 A | 6/1998 | Aoki et al. |
| 5,793,057 A | 8/1998 | Summerfelt |
| 6,008,539 A | 12/1999 | Shibata et al. |
| 6,117,700 A | 9/2000 | Orita et al. |
| 6,121,127 A | 9/2000 | Shibata et al. |
| 6,204,512 B1 | 3/2001 | Nakamura et al. |
| 6,239,490 B1 | 5/2001 | Yamada et al. |
| 6,268,618 B1 | 7/2001 | Miki et al. |

FOREIGN PATENT DOCUMENTS

| | | |
|---|---|---|
| EP | 541 373 | 5/1993 |
| EP | 622 858 | 11/1994 |
| JP | 2-257679 | 10/1990 |

(List continued on next page.)

OTHER PUBLICATIONS

Lundberg et al., "Thermally stable low ohmic contact to 6H—SiC using cobalt silicides," Solid State Electronics, vol. 39, No. 11, pp. 1559–1565.
Nakamura, Patent Abstracts of Japan, Publication No. 02129919, Pub. date May 1997.
Nakamura, Patent Abstracts of Japan, Publication No. 09129932, Pub. date May 1975.
Brandt et al., "High p–type conductivity in cubic GaN/GaAs (113)A by using Be as the acceptor and O as the codopant," Apply. Physics Lett. 69 (18), Oct. 28, 1996.
Makoto, "Semiconductor Optical Element," Patent Abstracts of Japan, Sep. 27, 1996.

*Primary Examiner*—Savitri Mulpuri
(74) *Attorney, Agent, or Firm*—McGinn & Gibb, PLLC

(57) ABSTRACT

A layer comprising cobalt (Co) is formed on a p$^+$ layer by vapor deposition, and a layer comprising gold (Au) is formed thereon. The two layers are alloyed by a heat treatment to form a light-transmitting electrode. The light-transmitting electrode therefore has reduced contact resistance and improved light transmission properties, and gives a light-emitting pattern which is stable over a long time. Furthermore, since cobalt (Co) is an element having a large work function, satisfactory ohmic properties are obtained.

12 Claims, 7 Drawing Sheets

FOREIGN PATENT DOCUMENTS

| | | |
|---|---|---|
| JP | 5-183189 | 7/1993 |
| JP | 05-291621 | 11/1993 |
| JP | 8-032115 | 2/1994 |
| JP | 6-314822 | 11/1994 |
| JP | 7-249795 | 9/1995 |
| JP | 8-51235 | 2/1996 |
| JP | 08-032115 | 2/1996 |
| JP | 805 500 | 11/1997 |
| JP | 410209493 | 8/1998 |
| JP | 410229219 | 8/1998 |
| JP | 411040850 | 2/1999 |
| JP | 11191641 A | 7/1999 |
| JP | 11274562 | 11/1999 |
| JP | 411310498 | 11/1999 |
| JP | 200019581 | 7/2000 |

FIG. 3

| CASE NO. | FIRST METAL LAYER (THICKNESS) | SECOND METAL LAYER (THICKNESS) | THIRD METAL LAYER (THICKNESS) | EVALUATION | | |
|---|---|---|---|---|---|---|
| | | | | $N_2 + O_2$ (1%) | LOW VACUUM | $N_2$ |
| 1 | Co (40 Å) | Au (60 Å) | - | ○ | ○ | × |
| 2 | Au (40 Å) | Co (60 Å) | - | ○ | ○ | × |
| 3 | Co + Au (100 Å) | - | - | ○ | ○ | × |
| 4 | Co (20 Å) | Mg (20 Å) | Au (60 Å) | ○ | ○ | ○ |
| 5 | Co (40 Å) | Pd + Pt (80 Å) | - | × | ○ | ○ |

RATINGS:  ○ : DRIVING VOLTAGE (Vf) < 4V
△ : 4V ≤ DRIVING VOLTAGE (Vf) < 5V
× : DRIVING VOLTAGE (Vf) ≥ 5V

FIG. 4

| CASE NO. | FIRST METAL LAYER (THICKNESS) | SECOND METAL LAYER (THICKNESS) | EVALUATION | | |
|---|---|---|---|---|---|
| | | | $N_2 + O_2$ (1%) | LOW VACUUM | $N_2$ |
| 1 | Pd (40 Å) | Au (60 Å) | ○ | ○ | ○ |
| 2 | Au (40 Å) | Pd (60 Å) | ○ | ○ | ○ |
| 3 | Pd + Pt (100 Å) | - | × | ○ | × |
| 4 | Pd (100 Å) | - | × | ○ | △ |

RATINGS:
○ : DRIVING VOLTAGE (Vf) < 4V
△ : 4V ≤ DRIVING VOLTAGE (Vf) < 5V
× : DRIVING VOLTAGE (Vf) ≥ 5V

GAN RELATED COMPOUND SEMICONDUCTOR AND PROCESS FOR PRODUCING THE SAME

This is a continuation of application Ser, No. 09/819,622, which was filed on Mar. 29, 2001, which is a divisional of application Ser. No. 08/979,346, which was filed on Nov. 26, 1997, now U.S. Pat. No. 6,291,840, the contents of both of which are incorporated by reference in their entirety.

This application claims foreign priority from Japanese applications Hei. 8-334956 filed Nov. 29, 1996; Hei. 9-19748 filed Jan. 17, 1997; and Hei. 9-47064 filed Feb. 14, 1997, all of which are incorporated herein by reference.

BACKGROUND OF THE INVENTION

1. Field of the Invention

The present invention relates to a device having a light-transmitting electrode and a pad electrode which are formed on a p-type GaN related compound semiconductor layer.

2. Description of the Related Art

In conventional compound semiconductors, an ohmic contact is obtained by depositing metals on the semiconductor surface and heating the metals to convert the same to an alloy and to cause metal diffusion into the semiconductor, because an ohmic contact is not obtainable by the mere deposition of metals.

Even when p-type GaN related compound semiconductors are subjected to a treatment for reducing resistance, e.g., irradiation with electron beams, the thus-treated semiconductors still have higher resistivities than n-type GaN related compound semiconductors. Consequently, in such p-type GaN related compound semiconductors, the p-type layer has almost no current flow in lateral directions, and only the part thereof directly beneath the electrode emits light.

Under these circumstances, a current-diffusing electrode having light transmission properties and ohmic properties has been proposed which is formed by depositing a nickel (Ni) layer and a gold (Au) layer, each having a thickness of several tens of angstroms, (Å) and heating the metal layers (see Japanese Unexamined Patent Publication No. Hei. 6-314822).

However, the electrode formed by depositing nickel (Ni) and gold (Au) each having a thickness of several tens of angstroms and heating the metals poses a problem that the light-emitting pattern quality deteriorates with the lapse of time, resulting in an increased driving voltage. However, the electrode has satisfactory optical and electrical characteristics in the initial stage.

The reason for the quality deterioration is believed to be as follows. Since the nickel (Ni) and gold (Au) deposited layers are extremely thin, part of the nickel (Ni) is replaced by gold (Au) during the heat treatment, and the nickel (Ni) exposed on the electrode surface oxidizes to form NiO. When current is caused to flow through the electrode in this state, the NiO reacts with an OH⁻ group of water present in the surrounding atmosphere to form a substance comprising NiOOH, as shown by the following scheme (1). Since NiOOH has poor wettability by gold (Au) and by the GaN related compound semiconductor, the NiOOH aggregates. As a result, light-emitting pattern quality deteriorates with the lapse of time and the contact resistance of the electrode increases. Thus, conventional art devices employing the proposed electrode are believed to deteriorate in optical and electrical characteristics.

$$NiO + OH^- \rightarrow NiOOH + e^- \quad (1)$$

Further, since this current-diffusing electrode is thin, a pad electrode made of Ni/Au or Au is formed thereon for bonding.

However, the conventional art device described above has insufficient adhesion between the pad electrode and the current-diffusing electrode. Hence, if the surface of the current-diffusing electrode on which a pad electrode is to be formed has been soiled, there is a problem that the finally obtained device has problems such as the peeling of the pad electrode and a poor light-emitting pattern. In addition, even if the pad electrode has satisfactory adhesion to the current-diffusing electrode, the light emission occurring in the shade of the bonding pad cannot be directly observed, unavoidably resulting in a light emission loss.

Further, there is still another problem as follows.

In conventional GaN related compound semiconductors, low-resistivity p-type conduction is not obtainable by mere doping with a p-type impurity. It has hence been proposed to impart p-type low resistance to a GaN related compound semiconductor doped with a p-type impurity by irradiating the doped semiconductor with electron beams (see Japanese Unexamined Patent Publication No. Hei. 2-257679) or by subjecting the doped semiconductor to thermal annealing (see Japanese Unexamined Patent Publication No. Hei. 5-183189). It has also been proposed to conduct the thermal annealing for imparting p-type low resistance simultaneously with alloying for forming an electrode (see Japanese Unexamined Patent Publication No. Hei. 8-51235).

However, in the method using thermal annealing described in Japanese Unexamined Patent Publication No. Hei. 5-183189, the heat treatment should be conducted at a temperature not lower than 700° C. in order to obtain a saturated low resistivity. Although this kind of semiconductor has conventionally employed aluminum as the main electrode material, use of a temperature not lower than 700° C. for electrode alloying produces problems, such as the formation of aluminum balls resulting from aluminum melting, an impaired surface state, increased contact resistance of the electrode, and wire bonding failure.

Consequently, the heat treatment for electrode alloying should be conducted at a relatively low temperature of from 500 to 600° C. It is, however, noted that the heat treatment for imparting p-type low resistance does not result in a sufficiently low resistivity when conducted at a temperature in the range of from 500 to 600° C. It has hence been necessary to conduct the heat treatment for imparting p-type low resistance and the heat treatment for electrode alloying as separate steps, respectively.

On the other hand, Japanese Patent Publication No. Hei. 8-51235 proposes to conduct the impartation of p-type low resistance simultaneously with electrode alloying by performing a heat treatment at a temperature of from 400 to 800° C. However, this method has the following problems. The impartation of p-type low resistance is insufficient in the low-temperature range where electrode alloying is achieved satisfactorily. In the high-temperature region suitable for the sufficient impartation of p-type low resistance, electrode alloying cannot be conducted satisfactorily, resulting in increased contact resistance and poor ohmic properties.

SUMMARY OF THE INVENTION

In view of the problems described above, an object of the present invention is to realize a GaN related compound semiconductor light-emitting device which has light transmission properties and ohmic properties and retains a stable light-emitting pattern and a constant driving voltage over a long period of time, and to realize processes for producing the device.

Another object of the present invention is to impart p-type low resistance to a GaN related compound semiconductor through a heat treatment so that a saturated low resistivity value can be realized using a lower temperature for the treatment.

Still another object of the present invention is to realize the impartation of p-type low resistance at a lower temperature to thereby sufficiently impart p-type low resistance and obtain an electrode having low contact resistance and satisfactory ohmic properties, even when the heat treatment for imparting p-type low resistance and that for electrode alloying are conducted as the same step.

Still another object of the present invention is to improve the adhesion between a pad electrode and a current-diffusing electrode to thereby prevent the pad electrode from peeling off and, at the same time, to form a high-resistivity region under the pad so that current flows in the current-diffusing electrode selectively through areas other than that under the pad to thereby diminish light emission under the pad and attain effective utilization of light emission.

The above-described problem is eliminated with the light-emitting device of the present invention according to a first aspect of the present invention. This light-emitting device has a p-type GaN related compound semiconductor layer having formed thereon an electrode which transmits light to the semiconductor layer and which is a metal layer comprising a cobalt (Co) alloy, palladium (Pd), or a palladium (Pd) alloy. Since the elements constituting the electrode are unsusceptible to oxidation, not only is the electrode prevented from suffering the light-emitting pattern change with time caused by electrode oxidation to thereby give a stable light-emitting pattern over a long period of time, but also the electrode can have reduced contact resistance to thereby enable a constant driving voltage over a long period of time. In addition, since cobalt (Co) and palladium (Pd) each is an element having a large work function, satisfactory ohmic properties are obtained.

The metal layer comprising a cobalt (Co) alloy may be formed from one member selected from the group consisting of a two-layer structure comprising a first metal layer made of cobalt (Co) and a second metal layer made of gold (Au) formed on the first metal layer, a two-layer structure comprising a first metal layer made of gold (Au) and a second metal layer made of cobalt (Co) formed on the first metal layer, and an alloy layer made of cobalt (Co) and gold (Au), by alloying the one member through a heat treatment. This metal layer is free from the problem in electrodes made of cobalt (Co) alone that the light-emitting pattern changes with the lapse of time because of the susceptibility of cobalt (Co) to oxidation. Specifically, the electrode formed by heating a two-layer structure comprising a layer made of cobalt (Co) and a layer made of gold (Au) or by heating a layer of an alloy of cobalt (Co) with gold (Au) is prevented from undergoing cobalt (Co) oxidation, has reduced contact resistance, enables a stable light-emitting pattern over a long period of time, and has excellent light transmission properties.

An electrode which has reduced contact resistance, enables a stable light-emitting pattern over a long period of time, and has excellent light transmission properties is also obtained from a three-layer structure comprising a first metal layer made of cobalt (Co), a second metal layer made of a group II element formed on the first metal layer, and a third metal layer made of gold (Au) formed on the second metal layer, by alloying the three-layer structure through a heat treatment, or obtained from a two-layer structure comprising a first metal layer made of cobalt (Co) and a second metal layer made of an alloy of palladium (Pd) with platinum (Pt) formed on the first metal layer, by alloying the two-layer structure through a heat treatment. Effective examples of the group II element include beryllium (Be), magnesium (Mg), calcium (Ca), strontium (Sr), barium (Ba), zinc (Zn), and cadmium (Cd).

The metal layer comprising a palladium (Pd) alloy may be formed from either a two-layer structure comprising a first metal layer made of palladium (Pd) and a second metal layer made of gold (Au) formed on the first metal layer, or a two-layer structure comprising a first metal layer madeiof gold (Au) and a second metal layer made of palladium (Pd) formed on the first metal layer, by alloying the two-layer structure through a heat treatment. Thus, an electrode is obtained which has reduced contact resistance, enables a stable light-emitting pattern over a long period of time, and has excellent light transmission properties.

An electrode which has reduced contact resistance, enables a stable light-emitting pattern over a long period of time, and has excellent light transmission properties is obtained also from a layer made of an alloy of palladium (Pd) with platinum (Pt) by alloying the layer through a heat treatment.

A metal layer may be formed on a p-type GaN related compound semiconductor layer through a heat treatment conducted at a temperature from 400 to 700° C. The metal layer formed can be a satisfactorily alloyed layer. Thus, an electrode having stable light-emitting properties and stable electrical characteristics can be obtained.

A metal layer having reduced contact resistance can be formed through a heat treatment conducted under low-vacuum conditions. The term "low-vacuum conditions" used herein means a pressure of 10 Torr or lower.

A metal layer having reduced contact resistance can be formed through a heat treatment without reducing light-emitting pattern quality, by conducting the heat treatment in an atmosphere comprising at least oxygen ($O_2$) or a gas containing oxygen (O), or by conducting the heat treatment in an inert gas atmosphere. The term "atmosphere comprising oxygen ($O_2$)" as used herein include 100% oxygen ($O_2$). The term "gas containing oxygen (O)" means CO, $CO_2$, etc. Effective examples of the inert gas contemplated by the present invention include nitrogen ($N_2$), helium (He), neon (Ne), argon (Ar), and krypton (Kr).

Further, the above-described problem is eliminated with the process for producing a p-type GaN related compound semiconductor of the present invention according to a second aspect of the present invention. This process for producing a p-type GaN related compound semiconductor comprises subjecting a GaN related compound semiconductor doped with a p-type impurity to a heat treatment in a gas comprising at least oxygen.

Further, the above-described problem is eliminated by the process for producing a p-type GaN related compound semiconductor having a p-type GaN related compound semiconductor layer and an electrode according to a third aspect of the present invention. This process for producing a GaN related compound semiconductor device having a p-type GaN related compound semiconductor layer and an electrode comprises: forming a layer of a GaN related compound semiconductor doped with a p-type impurity; forming an electrode on the GaN related compound semiconductor layer; and subjecting the GaN related compound semiconductor layer having the electrode formed thereon to a heat treatment in a gas comprising at least oxygen.

Furthermore, the above-described problem is eliminated by the process for producing GaN related compound semiconductor having a p-type GaN related compound semiconductor layer, an n-type GaN related compound semiconductor layer, and two electrodes respectively for these layers according to a fourth aspect of the present invention. This process for producing a GaN related compound semiconductor device having a p-type GaN related compound semiconductor layer, an n-type GaN related compound semiconductor layer, and two electrodes respectively for these layers comprises:

forming a first electrode on the GaN related compound semiconductor layer doped with a p-type impurity, and forming a second electrode on the n-type GaN related compound semiconductor; and subjecting the resultant structure to a heat treatment in a gas comprising at least oxygen.

The term "GaN related compound semiconductor" means a compound which is based on GaN and contains one or more group III elements, e.g., In and Al, by which part of the gallium has been replaced. An example of the GaN related compound semiconductor is a four-element compound represented by the general formula $(Al_xGa_{1-x})_yIn_{1-y}N$ ($0 \leq x \leq 1$, $0 \leq y \leq 1$).

The gas comprising oxygen used in each of the processes according to the present invention may be at least one member selected from $O_2$, $O_3$, $CO$, $CO_2$, $NO$, $N_2O$, $NO_2$, and $H_2O$ or a mixed gas comprising two or more of these members. The gas comprising oxygen may also be a mixed gas comprising at least one of $O_2$, $O_3$, $CO$, $CO_2$, $NO$, $N_2O$, $NO_2$, and $H_2O$ and one or more inert gases, or be a mixed gas comprising a mixture of two or more of $O_2$, $O_3$, $CO$, $CO_2$, $NO$, $N_2O$, $NO_2$, and $H_2O$ and one or more inert gases. In short, the gas comprising oxygen means a gas containing oxygen atoms or a gas of molecules containing oxygen atoms.

The pressure of the atmosphere in which the heat treatment is conducted is not particularly limited as long as the GaN related compound semiconductor is not pyrolyzed at the temperature used for the heat treatment. In the case where $O_2$ gas alone is used as the gas comprising oxygen, the gas may be introduced at a pressure higher than the decomposition pressure for the GaN related compound semiconductor. In the case where a mixture of $O_2$ with an inert gas is used, the pressure of the whole mixed gas is regulated to a value higher than the decomposition pressure for the GaN related compound semiconductor. In this case, an $O_2$ gas proportion not smaller than about $10^{-6}$ based on the whole mixed gas is sufficient. In short, an extremely small amount of oxygen suffices to the gas comprising oxygen for the reason which will be given later. There is no particular upper limit on the amount of the gas comprising oxygen introduced from the standpoints of the impartation of p-type low resistance and electrode alloying. Any high pressure is usable as long as production is possible.

The most preferred range of the temperature for the heat treatment is from 500 to 600° C. As will be described later, a p-type GaN related compound semiconductor having a completely saturated resistivity can be obtained at temperatures not lower than 500° C. At temperatures not higher than 600° C., the alloying treatment of an electrode can be conducted satisfactorily.

Preferred temperature ranges are from 450 to 650° C., from 400 to 600° C., and from 400 to 700° C. The lower the temperature, the higher the p-type resistivity. The higher the temperature, the poorer the electrode properties and the higher the possibility for thermal deterioration of crystals.

The first electrode desirably comprises a metal layer which comprises a cobalt (Co) alloy, palladium (Pd), or a palladium (Pd) alloy and has light transmission properties and ohmic properties. This metal layer comprising a cobalt (Co) alloy is a layer formed from a two-layer structure comprising a first metal layer made of cobalt (Co) and a second metal layer made of gold (Au) formed on the first metal layer, from a two-layer structure comprising a first metal layer made of gold (Au) and a second metal layer made of cobalt (Co) formed on the first metal layer, or from a layer of an alloy of cobalt (Co) with gold (Au), by alloying the same through a heat treatment. Alternatively, the metal layer comprising a cobalt (Co) alloy is a layer formed from a three-layer structure comprising a first metal layer made of cobalt (Co), a second metal layer made of a group II element formed on the first metal layer, and a third metal layer made of gold (Au) formed on the second metal layer, by alloying the three-layer structure through a heat treatment. The metal layer comprising a palladium (Pd) alloy is a layer formed from a two-layer structure comprising a first metal layer made of palladium (Pd) and a second metal layer made of gold (Au) formed on the first metal layer or from a two-layer structure comprising a first metal layer made of gold (Au) and a second metal layer made of palladium (Pd) formed on the first metal layer, by alloying the two-layer structure through a heat treatment.

The first electrode can be a layer formed by alloying, through a heat treatment, a two-layer structure comprising a first metal layer made of nickel (Ni) and a second metal layer made of gold (Au) formed thereon.

The above-described materials of the first electrode have been selected so as to result in satisfactory properties with respect to contact resistance with p-type GaN related compound semiconductors, light-emitting pattern, property change with time, junction strength, and ohmic properties.

The second electrode desirably comprises aluminum (Al) or an aluminum alloy. These electrode materials have been selected from the standpoints of contact resistance with n-type GaN related compound semiconductors and ohmic properties.

In the process according to the second aspect of the present invention, a gas comprising oxygen is used as the surrounding gas for the heat treatment. As a result, it has become possible to use a lower temperature for obtaining a GaN related compound semiconductor having p-type low resistance. As will be described later, use of temperatures not lower than 500° C. resulted in a saturated low value of resistivity. The resistivity began to decrease at around 400° C. At 450° C., the resistivity was about a half of that at 400° C.

In the processes according to the third and fourth aspects of the present invention, a saturated low resistivity suitable for practical use is obtained at lower temperatures as described above. Consequently, the heat treatment for imparting p-type low resistance and the heat treatment for electrode alloying can be carried out as the same step. As a result, processes for device production can be simplified. In addition, since the heat treatment can be conducted at a low temperature, thermal deterioration of devices can be alleviated.

With respect to the fact that the heat treatment in a gas comprising oxygen is effective in imparting low resistance at lower temperatures, the following explanation is given by the present inventors. A GaN related compound semiconductor cannot be made to have p-type low resistance by merely doping the same with a p-type impurity, e.g., magnesium. This is because the atoms of the p-type impurity are bonded to hydrogen atoms and, hence, do not function as an acceptor. It is therefore thought that upon the removal of the hydrogen atoms bonded to the atoms of the p-type impurity, the impurity comes to function as an acceptor. When a heat treatment is conducted in a gas comprising oxygen, the separation of the impurity atoms from the hydrogen atoms is thought to be catalyzed by the oxygen. As a result, semiconductor devices having a reduced resistivity are obtainable at lower temperatures.

Still further, the above-described problem is eliminated with the GaN related compound semiconductor device having a p-type GaN related compound semiconductor according to a fifth aspect of the present invention. This GaN related compound semiconductor device having a p-type GaN related compound semiconductor comprises: a current-diffusing electrode having light transmission properties which has been formed on the p-type GaN related compound semiconductor and a pad electrode for bonding which has been formed on the current-diffusing electrode and contains at least one metal reactive with nitrogen. The device further includes a high-resistivity region on the p-type GaN related compound semiconductor in its part located under the pad electrode, the high-resistivity region having been formed through an alloying treatment by the reaction of the metal with the p-type GaN related compound semiconductor.

According to this device, a current-diffusing electrode having light transmission properties is formed on a p-type GaN related compound semiconductor, and a pad electrode containing at least one metal reactive with nitrogen is formed thereon.

In an alloying treatment, the metal reactive with nitrogen which is contained in the pad electrode reacts with the p-type GaN related compound semiconductor. As a result, the adhesion between the pad electrode and the current-diffusing electrode as well as between the pad electrode and p-type GaN surface is improved and the pad electrode can be prevented from peeling off. The reaction between the metal reactive with nitrogen contained in the pad electrode and the GaN related compound semiconductor further produces an effect that since the reaction generates nitrogen holes within part of the GaN related compound semiconductor, the donor attributable to these holes in that part compensates for an acceptor to thereby form a high-resistivity region in that part of the semiconductor. Consequently, current flows from the pad electrode not downward but in lateral directions along the current-diffusing electrode. Since the region of a pad electrode originally has a large thickness and no light transmission properties, it is virtually impossible to take light out of the device through the pad electrode or to cause external light to strike on the semiconductor through the pad electrode. According to the present invention, only the part where light is effectively utilizable can have an improved current density and, as a result, the effective efficiency of electricity-to-light conversion or light-to-electricity conversion is improved.

BRIEF DESCRIPTION OF THE DRAWINGS

In the accompanying drawings:

FIG. 3 is a presentation showing properties of the alloyed light-transmitting electrodes of light-emitting devices according to the first embodiment of the present invention;

FIG. 4 is a presentation showing properties of the alloyed light-transmitting electrodes of light-emitting devices according to a second embodiment of the present invention;

DETAILED DESCRIPTION OF THE PREFERRED EMBODIMENTS

The present invention will be explained below by reference to embodiments thereof. However, the invention should not be construed as being limited to the following embodiments.

1st Embodiment

Figure 1:
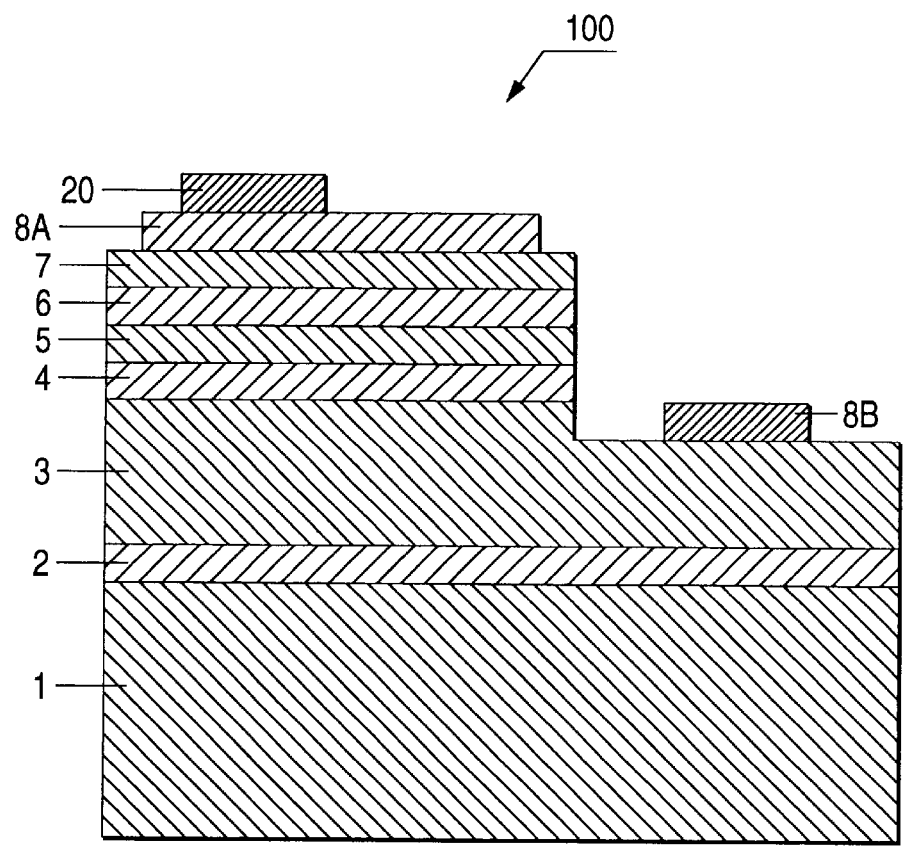
FIG. 1 is a sectional view illustrating the structure of a light-emitting device according to a first embodiment of the present invention.

FIG. 1 is a sectional view diagrammatically illustrating the structure of a light-emitting device 100 having a GaN related compound semiconductor formed over a sapphire substrate 1. This light-emitting device comprises a buffer layer 2 comprising AlN formed on the sapphire substrate 1 and a silicon (Si)-doped n-type CaN layer 3 ($n^+$ layer) formed on the buffer layer 2. The light-emitting device further comprises a silicon (Si)-doped n-type $Al_{0.1}Ga_{0.9}N$ layer 4 (n layer) having a thickness of 0.5 $\mu$m formed on the $n^+$ layer 3, an $In_{0.2}Ga_{0.8}N$ layer 5 (active layer) having a thickness of 0.4 $\mu$m formed on the n layer 4, and a magnesium (Mg)-doped p-type $Al_{0.1}Ga_{0.9}N$ layer 6 (p layer) formed on the active layer 5. A p-type GaN layer 7 ($p^+$ layer) heavily doped with magnesium (Mg) has been formed on the p layer 6. A light-transmitting electrode 8A has been formed on the $p^+$ layer 7 by metal vapor deposition, while an electrode 8B has been formed on the $n^+$ layer 3. The light-transmitting electrode 8A is constituted of cobalt (Co) bonding to the $p^+$ layer 7 and of a metallic element, e.g., gold (Au), bonding to the cobalt (Co) (the metallic element will be described later). The electrode 8B is constituted of aluminum (Al) or an aluminum alloy.

A process for producing the light-transmitting electrode 8A of this light-emitting device 100 is explained next.

The layers ranging from the buffer layer 2 to the p⁺ layer 7 are formed by metal-organic vapor-phase epitaxy (MOVPE). The gases which can be used are ammonia ($NH_3$), carrier gases ($H_2$, $N_2$), trimethylgallium ($Ga(CH_3)_3$) (hereinafter referred to as "TMG"), trimethylaluminum ($Al(CH_3)_3$) (hereinafter referred to as "TMA"), silane ($SiH_4$), cyclopentadienylmagnesium ($Mg(C_5H_5)_2$) (hereinafter referred to as "$Cp_2Mg$"), and trimethylindium ($In(CH_3)_3$) (hereinafter referred to as "TMI"). And a mask layer ($SiO_2$ or the like) is formed on the p⁺ layer 7, and the predetermined area of the mask layer is removed. Those parts of the p⁺ layer 7, p layer 6, active layer 5, and n layer 4 which are uncovered by the resultant mask are removed by reactive ion etching with a gas containing chlorine to expose a surface of the n⁺ layer. The mask is then removed.

Subsequently, the light-transmitting electrode 8A is formed by conducting the following procedure.

A photoresist 9 is evenly applied to the surface. That part of the photoresist 9 which corresponds to the area where the electrode is to be formed on the p⁺ layer 7 is removed by photolithography to form a window part 9A as shown in FIG. 2.

Figure 2:
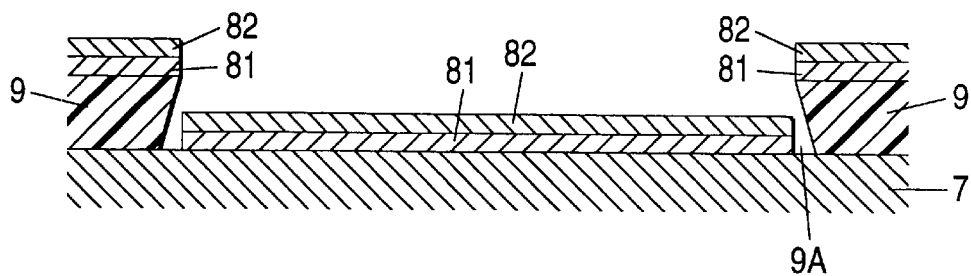
FIG. 2 is a sectional view diagrammatically illustrating the structure of an electrode formed on the surface of a $p^+$ layer.

Using a vapor deposition apparatus, cobalt (Co) is deposited in a thickness of 40 Å on the exposed p⁺ layer 7 under a high vacuum on the order of $10^{-6}$ Torr or less to form a first metal layer 81 as shown in FIG. 2.

Gold (Au) is then deposited on the first metal layer 81 in a thickness of 60 Å to form a second metal layer 82 as shown in FIG. 2.

Subsequently, the sample is taken out of the vapor deposition apparatus. The cobalt and gold deposited on the photoresist 9 are removed by the lift-off method to form an electrode 8A which transmits light to the p⁺ layer 7.

In the case where a bonding electrode pad 20 is to be formed on part of the light-transmitting electrode 8A, a photoresist is applied evenly, and that part of the photoresist which corresponds to the pad formation part is removed to form a window. Subsequently, a film of an alloy of cobalt (Co) or nickel (Ni) with gold (Au), aluminum (Al) or both is formed by vapor deposition in a thickness of about 1.5 μm. The film alloy of cobalt or nickel with gold, aluminum, or both which has been vapor-deposited on the photoresist is removed by the lift-off method as mentioned above to thereby form an electrode pad 20.

Thereafter, the atmosphere surrounding the sample is evacuated with a vacuum pump, and a mixed gas of $N_2$ and $O_2$ (1%) is introduced into the deposition apparatus to adjust the internal pressure to atmospheric pressure. The temperature of this atmosphere surrounding the sample is elevated to about 550° C. to heat the sample for about 3 minutes. Thus, the first metal layer 81 and the second metal layer 82 are alloyed.

This heat treatment can be conducted under the following conditions. A surrounding gas containing one or more of $N_2$, He, $O_2$, Ne, Ar, and Kr is utilizable. Any pressure ranging from vacuum to pressures higher than atmospheric pressure can be used. The partial pressure of $N_2$, He, $O_2$, Ne, Ar, or Kr in the surrounding gas is from 0.01 to 1 atm. The heating may be conducted with the surrounding gas enclosed in the apparatus or while circulating the same through the apparatus.

As a result of the heat treatment after the deposition of cobalt (Co) and gold (Au), part of the gold (Au) constituting the second metal layer 82 formed on the first metal layer 81 made of cobalt (Co) is diffused through the first metal layer 81 on the p⁺ layer 7 to thereby form a good contact with GaN contained in the p⁺ layer 7.

When a current of 20 mA was caused to flow through the thus-formed light-transmitting electrode 8A, a driving voltage of 3.6 V was obtained. It was thus ascertained that the contact resistance was sufficiently low. The surface of the p₊ layer 7 was evenly covered with the thus-formed light-transmitting electrode 8A, which had a satisfactory surface state.

Since the light-transmitting electrode 8A is formed from a two-layer structure comprising the first metal layer 81 made of cobalt (Co) and the second metal layer 82 formed thereon, the cobalt (Co) is inhibited from oxidizing. As a result, the change of light-emitting pattern, decrease of light transmission properties, and increase of contact resistance all caused by cobalt (Co) oxidation can be prevented. In addition, since the light-transmitting electrode 8A is made of an alloy containing cobalt (Co), which has a large work function, satisfactory ohmic properties are obtained. This electrode 8A was tested by exposing the same to a high-temperature and high-humidity atmosphere for a prolonged period of time. As a result, the electrode was capable of stably maintaining the initial light-emitting pattern and driving voltage even after 1,000-hour exposure.

Besides the conditions used above for alloying the first metal layer 81 made of cobalt (Co) and the second metal layer 82 made of gold (Au), the following two sets of conditions were also used for this embodiment. One set of conditions was that the atmosphere surrounding the sample was evacuated with a vacuum pump to form a low-vacuum state and the temperature of this atmosphere surrounding the sample was elevated to about 550° C. to heat the sample for about 3 minutes to thereby alloy the first and second metal layers 81 and 82. The other set of conditions was that the atmosphere surrounding the sample was evacuated to vacuum, subsequently $N_2$ was introduced at a rate of 3 liter/min to adjust the internal pressure to atmospheric pressure, and then the temperature of this atmosphere surrounding the sample was elevated to about 550° C. to heat the sample for about 3 minutes to thereby alloy the first and second metal layers 81 and 82. The driving voltage of each device obtained was measured. The results obtained are shown in FIG. 3 under Case No. 1.

The three sets of atmospheric conditions described above were used for the alloying of: an electrode precursor comprising a first metal layer 81 made of gold (Au) and a second metal layer 82 made of cobalt (Co) (Case No. 2); an electrode precursor having only of a first metal layer 81 comprising an alloy of cobalt (Co) with gold (Au) (Case No. 3); a three-layer precursor for light-transmitting electrode which was constituted by a first metal layer 81 made of cobalt (Co), a second metal layer 82 made of magnesium (Mg), and a third metal layer made of gold (Au) formed on the second metal layer (Case No. 4); and an electrode precursor comprising of a first metal layer 81 made of cobalt (Co) and a second metal layer 82 made of an alloy of palladium (Pd) with platinum (Pt) (Case No. 5). The driving voltage of each device obtained was measured. The results obtained are shown in FIG. 3.

The evaluation results given in FIG. 3 are based on the driving voltage measured when a current of 20 mA was caused to flow through the light-transmitting electrode 8A. In FIG. 3, ○ indicates that the driving voltage was lower than 4 V, and x indicates that the driving voltage was not lower than 5 V. In FIG. 3, the numeral in the parentheses for each metal layer indicates film thickness (Å).

All the device samples described above were subjected to a 1,000-hour continuous driving test in a high-temperature high-humidity atmosphere. The device samples indicated by ○ each had the same driving voltage and light-emitting pattern as the initial ones even after the 1,000-hour driving test, and retained optically and electrically stable properties over a long period of time.

In Case No. 1 shown in FIG. 3, a device having a driving voltage not lower than 5 V was measured at a current of 20 mA. Hence, increased contact resistance was obtained when alloying was conducted in $N_2$ (alone) in the absence of $O_2$. Through alloying under low-vacuum conditions, a device having a driving voltage lower than 4 V, and hence reduced contact resistance, was obtained. In the case where a light-transmitting electrode 8A is formed from a two-layer structure comprising a first metal layer 81 made of cobalt (Co) and a second metal layer 82 made of gold (Au) as in Case No. 1, a light-emitting pattern which is stable over a long period of time and a low driving voltage is obtained by alloying the two-layer structure either in the atmosphere containing $O^2$ or under the low-vacuum conditions.

As in Case No. 2 shown in FIG. 3, a first metal layer 81 made of gold (Au) having a thickness of 40 Å may be formed before a second metal layer 82 made of cobalt (Co) is formed thereon with a thickness of 60 Å. A light-emitting pattern which is stable over a long period of time and a low driving voltage are obtained in Case No. 2 by conducting alloying either in the atmosphere containing $O_2$ or under the low-vacuum conditions, as in Case No. 1.

As in Case No. 3 shown in FIG. 3, a first metal layer 81 may be formed by simultaneously vapor-depositing gold (Au) and cobalt (Co) with a thickness of 100 Å. A light-emitting pattern which is stable over a long period of time and a low driving voltage are obtained in Case No. 3 by conducting alloying either in the atmosphere containing $O_2$ or under the low-vacuum conditions, as in Cases Nos. 1 and 2.

As in Case No. 4 shown in FIG. 3, a light-transmitting electrode 8A having a three-layer structure may be formed by forming an electrode precursor comprising a first metal layer 81 made of cobalt (Co) having a thickness of 20 Å, a second metal layer 82 formed thereon which is made of magnesium (Mg) having a thickness of 20 Å, and a 60 Å-thick layer of gold (Au) formed on the second metal layer 82. In Case No. 4, any of the atmosphere containing $O_2$ the low-vacuum conditions, and the $N_2$ atmosphere can be used for obtaining a light-emitting pattern which is stable over a long period of time and a low driving voltage.

As in Case No. 5 shown in FIG. 3, palladium (Pd) and platinum (Pt) may be simultaneously vapor-deposited as a second metal layer 82 with a thickness of 80 Å on a first metal layer 81 made of cobalt (Co) having a thickness of 40 Å. A light-emitting pattern which is stable over a long period of time and a low driving voltage can be obtained in Case No. 5 by conducting alloying either under the low-vacuum conditions or in the $N_2$ atmosphere.

As described above, the light-transmitting electrode 8A may be formed from a two-layer structure comprising a first metal layer 81 made of cobalt (Co) and a second metal layer 82 formed thereon, or from a two-layer structure comprising a first metal layer 81 made of gold (Au) and a second metal layer 82 made of cobalt (Co) formed thereon, or from a single-layer structure comprising a first metal layer 81 made of a gold (Au)-cobalt (Co) alloy.

Although magnesium (Mg) was used as the material of a constituent metal layer in Case No. 4 in the embodiment described above, other group II elements may be used, such as beryllium (Be), calcium (Ca), strontium (Sr), barium (Ba), zinc (Zn), and cadmium (Cd).

2nd Embodiment

In contrast to the first embodiment described above, in which cobalt (Co) was used as the first metal layer 81 or second metal layer 82, this embodiment is characterized by employing a light-transmitting electrode 8A which is made of palladium (Pd) alone or a palladium (Pd) alloy, and contains no cobalt (Co).

The semiconductor devices used have the same constitution as in the first embodiment, except the composition of the light-transmitting electrode 8A. FIG. 4 shows the relationship between the composition of each of the precursors for the light-transmitting electrode 8A and the driving voltage as measured when a current of 20 mA was caused to flow through the light-transmitting electrode 8A after the precursor was alloyed under each of the same sets of conditions as those used for the first embodiment. The ratings used in FIG. 4 have the following meanings: ○ indicates that the driving voltage was lower than 4 V; Δ indicates that the driving voltage was 4 V or higher but below 5 V; and x indicates that the driving voltage was not lower than 5 V. The device samples indicated by ○ or Δ each had the same driving voltage and light-emitting pattern as the initial ones even after 1,000-hour driving test, and retained optically stable properties over a long period of time.

As in Case No. 1, a light-emitting pattern which is stable over a long period of time and a driving voltage as low as below 4 V were obtained by forming an electrode precursor comprising a first metal layer 81 made of 40 Å-thick palladium (Pd) formed on the $p^+$ layer 7 and a second metal layer 82 made of 60 Å-thick gold (Au) formed on the first metal layer 81, and then alloying the precursor under any of the three sets of conditions. Thus, the same effects as in the first embodiment could be obtained. In addition, since the light-transmitting electrode 8A was made of an alloy of palladium (Pd), which has a large work function, satisfactory ohmic properties were obtained as in the first embodiment.

As in Case No. 2, a light-emitting pattern which was stable over a long period of time and a low driving voltage were obtained by forming an electrode precursor comprising a first metal layer 81 made of 40 Å-thick gold (Au) formed on the $p^+$ layer 7 and a second metal layer 82 made of 60 Å-thick palladium (Pd) formed on the first metal layer 81, and then alloying the precursor under any of the three sets of conditions. Thus, the same effects as in Case No. 1 were obtained.

In Cases Nos. 1 and 2, two-layer structures were used for forming light-transmitting electrodes 8A. In contrast thereto, a 100 Å-thick single-layer structure was formed by simultaneously vapor-depositing palladium (Pd) and platinum (Pt) and was alloyed under low-vacuum conditions to form a light-transmitting electrode 8A, as in Case No. 3, whereby a light-emitting pattern which was stable over a long period of time and a low driving voltage were obtained.

Furthermore, as in Case No. 4, a light-transmitting electrode 8A was formed by forming a 100 Å-thick single-layer structure made of palladium (Pd) and alloying the structure under low-vacuum conditions, whereby a light-emitting pattern which was stable over a long period of time and a low driving voltage were obtained. A driving voltage of from 4 to 5 V was obtained when the single-layer structure was alloyed in an $N_2$ atmosphere.

As described above, by forming a light-transmitting electrode BA made of an alloy of palladium (Pd) with gold (Au) or platinum (Pt) or made of palladium (Pd) alone, a light-emitting pattern which was stable over a long period of time and a low driving voltage were obtained and the same effects as in the first embodiment could be obtained.

Although the temperature of the atmospheres used for alloying for producing the embodiments described above was regulated to about 550° C., usable alloying temperatures are not limited thereto. The heat treatment is desirably conducted at a temperature in the range of from 400 to 700° C. This is because heat treatments conducted at temperatures lower than 400° C. result in electrodes not showing ohmic properties, while heat treatments conducted at temperatures higher than 700° C. result in electrodes having increased contact resistance and an impaired surface morphology.

The light-emitting devices 100 shown above as embodiments of the invention each had a structure containing an active layer 5 consisting of a single layer of $In_{0.2}Ga_{0.8}N$. However, the light-emitting device of the invention may have a light-emitting layer which is made of a mixed crystal comprising four or three elements in any proportion, e.g., AlInGaN, or has a multi-quantum well structure consisting, e.g., of $In_{0.2}Ga_{0.8}N/GaN$ or a single-quantum well structure.

In producing the embodiments described above, an atmosphere containing 1% $O_2$ was used as an oxygen-containing atmosphere. However, a 100% $O_2$ atmosphere or an atmosphere containing a gas such as CO or $CO_2$ may be used.

The total thickness of the light-transmitting electrode 8A, including the first metal layer 81 and the second metal layer 82, is preferably not larger than 200 Å from the standpoint of obtaining light transmission properties. It is more preferably in the range of from 15 to 200 Å from the standpoints of adhesion and light transmission properties.

As shown above, the present invention brings about the following effects. By forming a metal layer comprising a cobalt (Co) alloy, palladium (Pd), or a palladium (Pd) alloy as a light-transmitting electrode on a surface of a semiconductor comprising a p-type GaN related compound, not only can the electrode be inhibited from oxidizing to thereby prevent the electrode from suffering a decrease in light transmission properties, but the electrode can also have reduced contact resistance to thereby enable a light-emitting pattern which is stable over a long period of time and a low driving voltage.

3rd Embodiment

The present invention will be explained below by reference to FIGS. 5 to 9.

Figure 5:
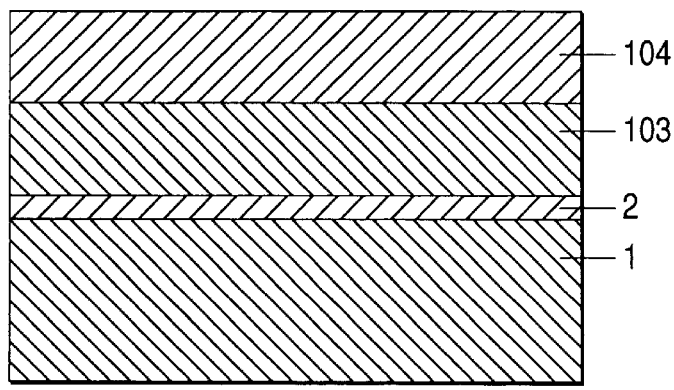
FIG. 5 is a sectional view illustrating the structure of samples used in the method for imparting p-type low resistance according a third embodiment of the present invention.

Many samples having the structure shown in FIG. 5 were prepared. Each sample was constituted by a sapphire substrate 1 and, formed thereon in this order, an AlN buffer layer 2 having a thickness of 50 nm, an n-GaN layer 103 made of a silicon (Si)-doped GaN having a thickness of about 4.0 μm, an electron concentration of $2\times10^{18}/cm^3$, and a silicon concentration of $4\times10^{18}/cm^3$, and a p-GaN layer 104 having a magnesium (Mg) concentration of $5\times10^{19}/cm^3$.

These samples were produced by MOVPE, like the aforementioned light-emitting devices 100.

First, a single-crystal sapphire substrate 1 having, as the main surface, a surface which had been cleaned by organic washing and heat treatment was mounted on a susceptor placed in the reaction chamber of an MOVPE apparatus. The sapphire substrate 1 was baked at 1,100° C. while passing Hz through the reaction chamber at a rate of 2 liter/min for about 30 minutes at ordinary pressure.

After the temperature of the substrate 1 was lowered to 400° C., $H_2$, $NH_3$, and TMA were fed for about 1.5 minutes at rates of 20 liter/min, 10 liter/min, and $1.8\times10^{-5}$ mol/min, respectively, to form an AlN buffer layer 2 in a thickness of about 50 nm.

Subsequently, while keeping the temperature of the sapphire substrate 1 at 1,150° C., $H_2$, $NH_3$, TMG, and silane diluted with $H_2$ gas to 0.86 ppm were fed for 40 minutes at rates of 20 liter/min, 10 liter/min, $1.7\times10^{-4}$ mol/min, and $20\times10^{-8}$ mol/min, respectively, to form an n-GaN layer 103 having a thickness of about 4.0 μm, an electron concentration of $2\times10^{18}/cm^3$, and a silicon concentration of $4\times10^{18}/cm^3$.

Thereafter, while keeping the temperature of the sapphire substrate 1 at 1,100° C., either $N_2$ or $H_2$, $NH_3$, TMG, and $CP_2Mg$ were fed for 40 minutes at rates of 10 liter/min, 10 liter/min, $1.7\times10^{-4}$ mol/min, and $2\times10^{-5}$ mol/min, respectively, to form a p-GaN layer 104 having a thickness of about 4.0 μm and a magnesium (Mg) concentration of $5\times10^{19}/cm^3$.

Many samples thus prepared were subjected to a 20-minute heat treatment at various temperatures in a 1-atm oxygen gas atmosphere (only of $O_2$). Needle electrodes were set up on each of the thus-treated p-GaN layers 104 to measure the current which flowed upon application of a voltage of 8 V, and the relationship between this current value and the heat treatment temperature used was determined. On the other hand, for the purpose of comparison, semiconductor samples were subjected to the same heat treatment as the above, except that 1-atm nitrogen gas (only of $N_2$) was used as the atmosphere for the heat treatment as in conventional processes, and the relationship between current value and heat treatment temperature was determined in the same manner. The values of resistivity were calculated, and the relationships between heat treatment temperature and resistivity are shown in FIG. 6.

Figure 6:
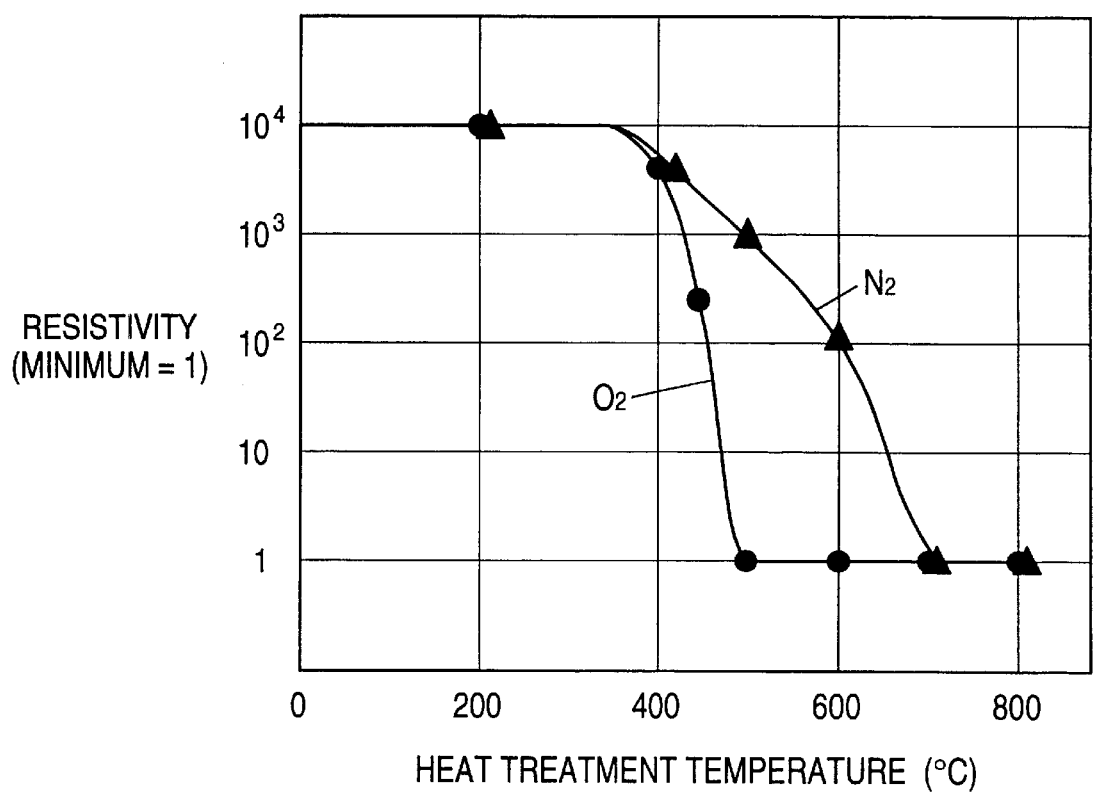
FIG. 6 is a graphic presentation showing changes in resistivity with changing heat treatment temperature in samples obtained by the method for imparting p-type low resistance according to the third embodiment of the present invention.

The following features can be understood from FIG. 6. 1) Both the heat treatment in oxygen atmosphere and the heat treatment in nitrogen atmosphere result in a decrease in resistivity [(resistivity before heat treatment)/(resistivity after heat treatment)] of $10^4$. Namely, there is no difference in the saturated resistivity value between the two kinds of heat treatments. 2) The saturated low resistivity value is obtained by a treatment at lower temperatures in the oxygen atmosphere than in the nitrogen atmosphere. 3) The heat treatment in oxygen atmosphere results in a more abrupt change in resistivity with changing heat treatment temperature than the heat treatment in nitrogen atmosphere. 4) The heat treatment in oxygen atmosphere at 500° C. results in a saturated low resistivity value, whereas the heat treatment in nitrogen atmosphere at 500° C. results in a resistivity change as small as about 10. Namely, the resistivity resulting from the heat treatment in oxygen atmosphere at 500° C. is lower by $10^3$ than that resulting from the heat treatment in nitrogen atmosphere at 500° C. 5) At 400° C., both the heat treatment in an oxygen atmosphere and that in a nitrogen atmosphere result in almost no decrease in resistivity. At temperatures higher than 400° C., the heat treatments are effective in reducing resistivity.

In summary, in the oxygen atmosphere, heating at temperatures not lower than 400° C. is effective in lowering resistivity. The heat treatment is desirably conducted at a temperature not lower than 500° C., because this treatment provides the completely saturated low resistivity value.

Figure 7:
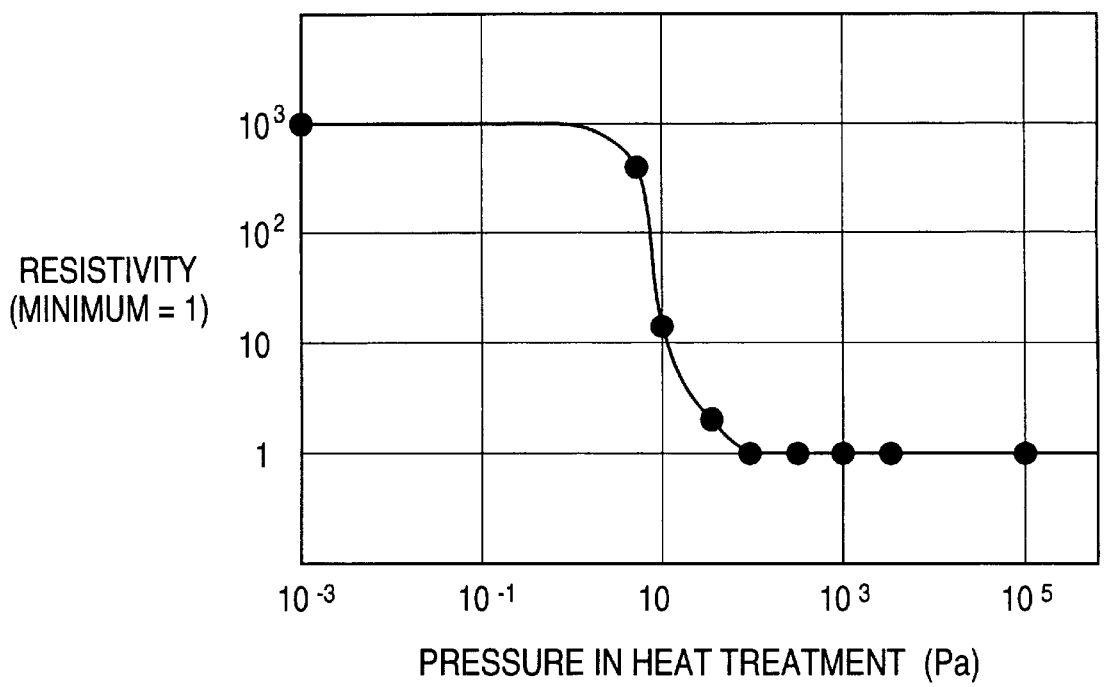
FIG. 7 is a graphic presentation showing a change in resistivity with changing oxygen gas pressure for heat treatment in samples obtained by the method for imparting p-type low resistance according to the third embodiment of the present invention.

The relationship between the pressure of oxygen gas and resistivity was then determined. At a temperature of 800° C., semiconductor samples were heat-treated at various pressures of oxygen gas. Needle electrodes were set up on each of the thus-treated p-GaN layers 104 to measure the current which flowed upon application of a voltage of 8 V, and the relationship between this current value and oxygen gas pressure was determined. The results obtained are shown in FIG. 7.

The following characteristics are understood from these results. 1) Resistivity drops abruptly in the oxygen gas pressure range of about from 3 to 30 Pa. 2) The heat treatment at oxygen gas pressures not lower than about 100 Pa results in a saturated low resistivity value.

It is understood from the above that oxygen contributes to the effective reduction of resistivity. Oxygen gas pressures of at least 3 Pa are effective in reducing resistivity. The oxygen gas atmosphere preferably has an oxygen pressure of 30 Pa or higher, more preferably 100 Pa.

Figure 8:
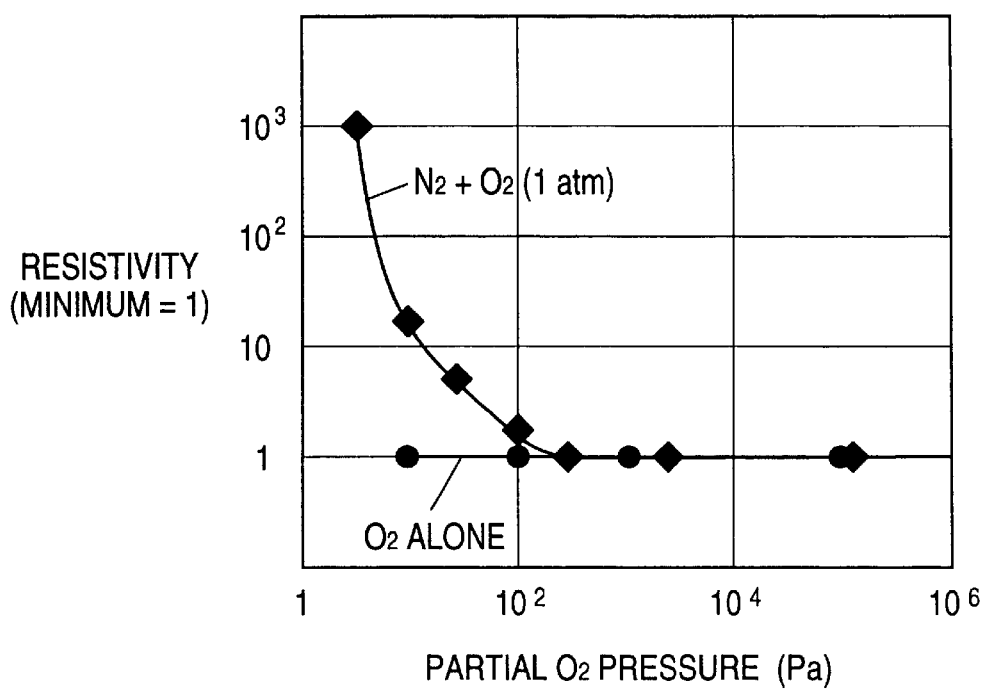
FIG. 8 is a graphic presentation showing a comparison between a change in resistivity with changing partial oxygen gas pressure in samples obtained by the method for imparting p-type low resistance according to the third embodiment of the present invention and a change in resistivity in samples obtained through heat treatment in pure oxygen gas atmospheres.

Subsequently, semiconductor samples were heat-treated at a temperature of 600° C. in mixed gas atmospheres (1 atm) containing oxygen gas and nitrogen gas to determine the change of resistivity with changing partial oxygen gas pressure in the same manner as the above. For the purpose of comparison, the change of resistivity with changing pressure in heat treatment in oxygen gas alone was determined. The results obtained are shown in FIG. 8. The results show that at partial oxygen gas pressures not lower than about 10 Pa, low resistivities are obtained. The results further show that the resistivity is saturated at pressures not lower than 30 Pa, ideally not lower than 100 Pa. To sum up, in the case of using a mixed gas containing oxygen gas and one or more other gases, the partial pressure of oxygen gas effective in reducing resistivity is 10 Pa or higher, preferably 30 Pa or higher, more preferably 100 Pa or higher.

A layer of a magnesium-doped GaN related compound semiconductor represented by $(Al_xGa_{1-x})_yIn_{1-y}N$ ($0 \leq x$, $y \leq 1$) gave the same results with respect to all the properties described above. It is thought that oxygen serves to remove the hydrogen atoms bonded to magnesium and to thereby activate the magnesium atoms. Consequently, besides pure oxygen gas, any gas containing oxygen (O) atoms capable of bonding to hydrogen atoms bonded to magnesium, e.g., a mixed gas containing oxygen and an inert gas, may be used to produce the same effect.

Figure 9:
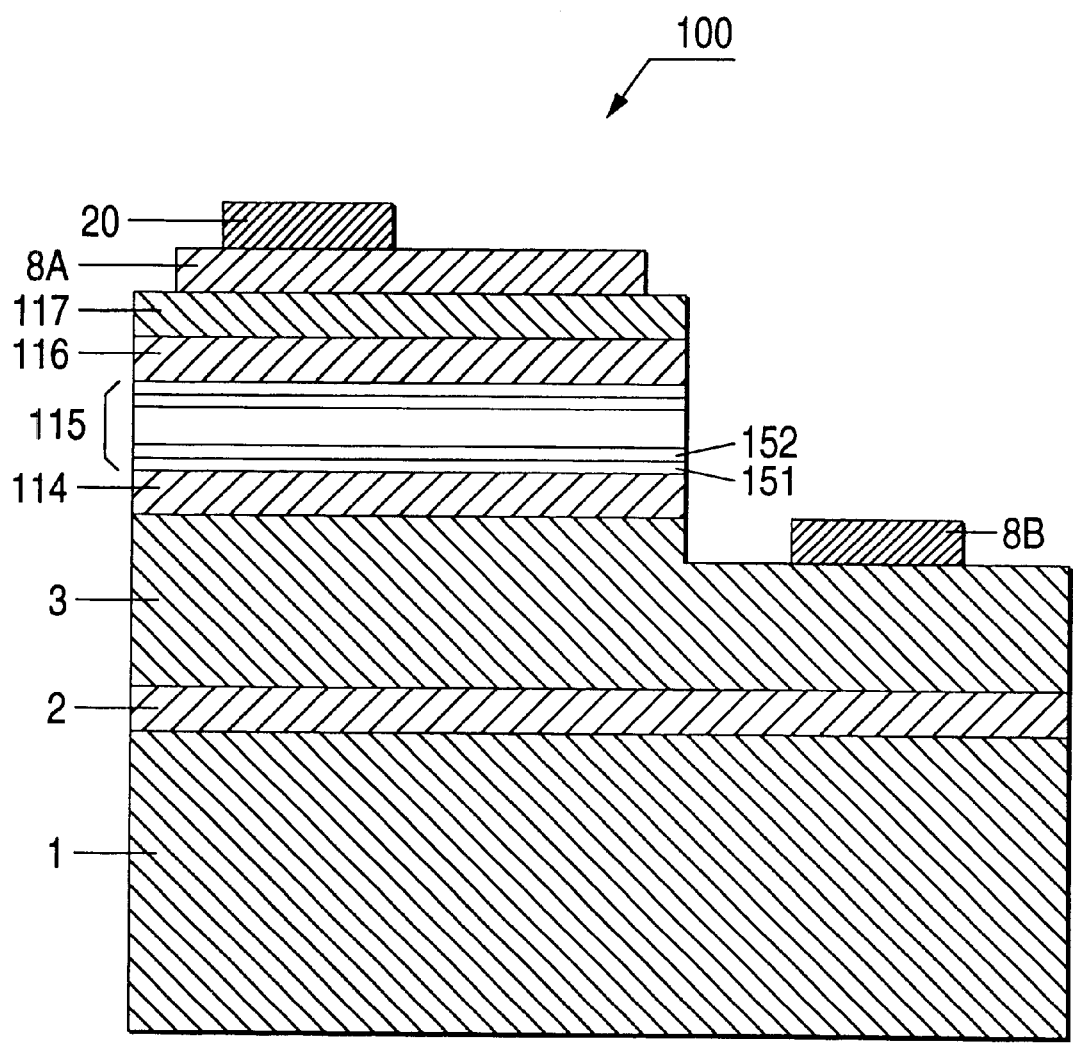
FIG. 9 is a sectional view illustrating the structure of a light emitting device produced by a process according to the third embodiment of the present invention.

An explanation is given below on a process for producing a light-emitting device 100 using the above-described method for imparting p-type low resistance by reference to FIG. 9. FIG. 9 is a sectional view diagrammatically illustrating the structure of a light-emitting device 100 having a GaN related compound semiconductor formed over a sapphire substrate 1. This light-emitting device 100 has the substantially same structure as the aforementioned embodiments. However, in this embodiment, a clad layer 114 made of silicon (Si)-doped n-type GaN is formed on the high-carrier-concentration $n^+$ layer 3.

Further, on the clad layer 114 has been formed a light emitting layer 115 having a multi-quantum well structure (MQW) comprising barrier layers 151 made of GaN each having a thickness of 35 Å and well layers 152 made of $In_{0.20}Ga_{0.80}N$ each having a thickness of 35 Å. The number of the barrier layers 151 is six, while the number of the well layers 152 is five. On the light-emitting layer 115 has been formed a clad layer 116 made of p-type $Al_{0.15}Ga_{0.85}N$. A contact layer 117 made of p-type GaN is formed on the clad layer 116.

A process for producing this light-emitting device 100 is explained next together with the steps which are not explained in the first embodiment.

The light-emitting device 100 was produced by MOVPE. The gases used were ammonia ($NH_3$), carrier gases ($H_2$, $N_2$), TMG, TMA, TMI, silane, and $CP_2Mg$.

First, a single-crystal sapphire substrate 1 having, as the main surface, a surface which had been cleaned by organic washing and heat treatment was mounted on a susceptor placed in the reaction chamber of an MOVPE apparatus. The sapphire substrate 1 was baked at 1,100° C. while passing $H_2$ through the reaction chamber at a rate of 2 liter/min for about 30 minutes at ordinary pressure.

After the temperature of the substrate 1 was lowered to 400° C., $H_2$, $NH_3$, and TMA were fed for about 1 minute at rates of 20 liter/min, 10 liter/min, and $1.8 \times 10_{-5}$ mol/min, respectively, to form an AlN buffer layer 2 in a thickness of about 25 nm.

Subsequently, while keeping the temperature of the sapphire substrate 1 at 1,150° C., $H_2$, $NH_3$, TMG, and silane diluted with $H_2$ gas to 0.86 ppm were fed for 40 minutes at rates of 20 liter/min, 10 liter/min, $1.7 \times 10^{-4}$ mol/min, and $20 \times 10^{-8}$ mol/min, respectively, to form a high-carrier-concentration $n^+$ layer 3 made of GaN and having a thickness of about 4.0 μm, an electron concentration of $2 \times 10^{18}/cm^3$, and a silicon concentration of $4 \times 10^{18}/cm^3$.

Thereafter, while keeping the temperature of the sapphire substrate 1 at 1,150° C., either $N_2$ or $H_2$, $NH_3$, TMG, TMA, and silane diluted with $H_2$ gas to 0.86 ppm were fed for 60 minutes at rates of 10 liter/min, 10 liter/min, $1.12 \times 10^{-4}$ mol/min, $0.47 \times 10^{-4}$ mol/min, and $5 \times 10^{-9}$ mol/min, respectively, to form a clad layer 114 made of GaN and having a thickness of about 0.5 μm, an electron concentration of $1 \times 10^{18}/cm^3$, and a silicon concentration of $2 \times 10^{18}/cm^3$.

Subsequent to the formation of the clad layer 114, either $N_2$ or $H_2$, $NH_3$, and TMG were fed for 1 minute at rates of 20 liter/min, 10 liter/min, and $2.0 \times 10^{-4}$ mol/min, respectively, to form a barrier layer 151 made of GaN and having a thickness of about 35 Å. Subsequently, TMG and TMI were fed for 1 minute at rates of $7.2 \times 10_{-5}$ mol/min and $0.19 \times 10^{-4}$ mol/min, respectively, while feeding either $N_2$ or $H_2$ and $NH_3$ at constant rates to thereby form a well layer 152 made of $In_{0.20}Ga_{0.80}N$ and having a thickness of about 35 Å. Under the same conditions as the above, five barrier layers 151 in total were formed alternately with five well layers 152 in total. Furthermore, a barrier layer 151 made of GaN was formed thereon. Thus, a light-emitting layer 115 of the 5-cycle MQW structure was formed.

Thereafter, while keeping the temperature of the sapphire substrate 1 at 1,100° C., either $N_2$ or $H_2$, $NH_3$, TMG, TMA, and $CP_2Mg$ were fed for 3 minutes at rates of 10 liter/min, 10 liter/min, $1.0 \times 10^{-4}$ mol/min, $1.0 \times 10_{-4}$ mol/min, and $2 \times 10^{-5}$ mol/min, respectively, to form a clad layer 116 made of magnesium (Mg)-doped p-type $Al_{0.15}Ga_{0.85}N$ and having a thickness of about 50 nm and a magnesium (Mg) concentration of $5 \times 10^{19}/cm^3$.

Subsequently, while keeping the temperature of the sapphire substrate 1 at 1,100° C., either $N_2$ or $H_2$, $NH_3$, TMG, and $CP_2Mg$ were fed for 30 seconds at rates of 20 liter/min, 10 liter/min, $1.12 \times 10_{-4}$ mol/min, and $2 \times 10^{-5}$ mol/min, respectively, to form a contact layer 117 made of magnesium (Mg)-doped p-type GaN and having a thickness of about 100 nm and a magnesium (Mg) concentration of $5 \times 10^{19}/cm^3$.

In this embodiment, a window is formed in a predetermined region of the photoresist by photolithography on the contact layer 117 through the aforementioned steps in the first embodiment. Under a high vacuum on the order of $10^{-6}$ Torr or below, vanadium (V) and aluminum (Al) are vapor-deposited in thickness of 200 Å and 1.8 μm, respectively. The photoresist and the $SiO_2$ mask are then removed.

Subsequently, a photoresist 9 is evenly applied to the surface. That part of the photoresist 9 which corresponds to the area where the electrode is to be formed on the contact layer 117 is removed by photolithography to form a window part 9A as shown in FIG. 2.

Using a vapor deposition apparatus, a first metal layer 81 made of cobalt (Co) is formed in a thickness of 15 Å on the exposed contact layer 117 under a high vacuum on the order of $10^{-6}$ Torr or below, and a second metal layer 82 made of gold (Au) is then formed in a thickness of 60 Å on the first metal layer 81.

Subsequently, the electrode 8A and electrode pad 20 are formed by the same processes as in the first embodiment.

Thereafter, the atmosphere surrounding the sample is evacuated with a vacuum pump, and $O_2$ gas is introduced into the deposition apparatus to adjust the internal pressure to 100 Pa. The temperature of this atmosphere surrounding the sample is elevated to about 550° C. to heat the sample for about 3 minutes. Thus, p-type low resistance is imparted to the contact layer 117 and clad layer 116 and, at the same time, the alloying of the contact layer 117, first metal layer 81, and second metal layer 82 and the alloying of the electrode 8B and n⁺ layer 3 are conducted.

As a result of this heat treatment, the resistivity of the contact layer 117 and that of the clad layer 116 became 1 Ωcm and 0.71 Ωcm, respectively. The most preferred range of the temperature for this heat treatment is from 500 to 600° C. As long as the heat treatment is conducted at a temperature in this range, the p-type layer reaches a sufficiently low saturated resistivity value and the electrodes 8A and 8B are alloyed most satisfactorily. As a result, not only can the contact resistance of electrodes or the sheet resistivity of the current-diffusing electrode be reduced and ohmic properties improved, but also the light-transmitting electrode 8A is prevented from oxidizing, whereby the finally obtained light-emitting device can be free from an uneven light-emitting pattern and undergo no change in light-emitting pattern with the lapse of time. The heat treatment can be conducted at a temperature of from 450 to 650° C., and can be conducted even in the range of from 400 to 700° C. in some cases. Heat treatment was further conducted in an atmosphere containing a mixture of $N_2$ gas and 1% $O_2$ gas and having a partial $O_2$ gas pressure of 100 Pa. As a result, the same effects as the above were obtained. All of the gases enumerated above which are used as the surrounding gas for heat treatment with regard to the impartation of p-type low resistance are also effective in the alloying of the electrodes 8A and 8B described in the first embodiment. Consequently, besides pure oxygen gas, a mixed gas can be utilized which contains $O_2$ and at least one of $N_2$, He, Ne, Ar, and Kr. Any pressure and any partial $O_2$ pressure within the aforementioned optimal ranges for the impartation of p-type low resistance are utilizable.

As a result of the heat treatment after the deposition of cobalt (Co) and gold (Au), part of the gold (Au) constituting the second metal layer 82 formed on the first metal layer 81 made of cobalt (Co) is diffused through the first metal layer 81 into the contact layer 117 to thereby form a goof contact with GaN contained in the contact layer 117.

It was ascertained that the light-emitting device 100 in this embodiment designates sufficiently low contact resistance and the stability with respect to the 1,000 hour continuous driving test just like the aforementioned embodiments.

Although magnesium (Mg) was used in a metal layer described above, it may be replaced by another group II element such as, e.g., beryllium (Be), calcium (Ca), strontium (Sr), barium (Ba), zinc (Zn), or cadmium (Cd).

Further, it is possible to apply other structures or other elements for the light-transmitting electrode 8A, the first metal layer 81, the second metal layer 82, the light-emitting layer 115 as described in the aforementioned embodiments.

4th Embodiment

The fourth embodiment of the present invention will be explained below by reference to FIGS. 10 and 11.

Figure 10:
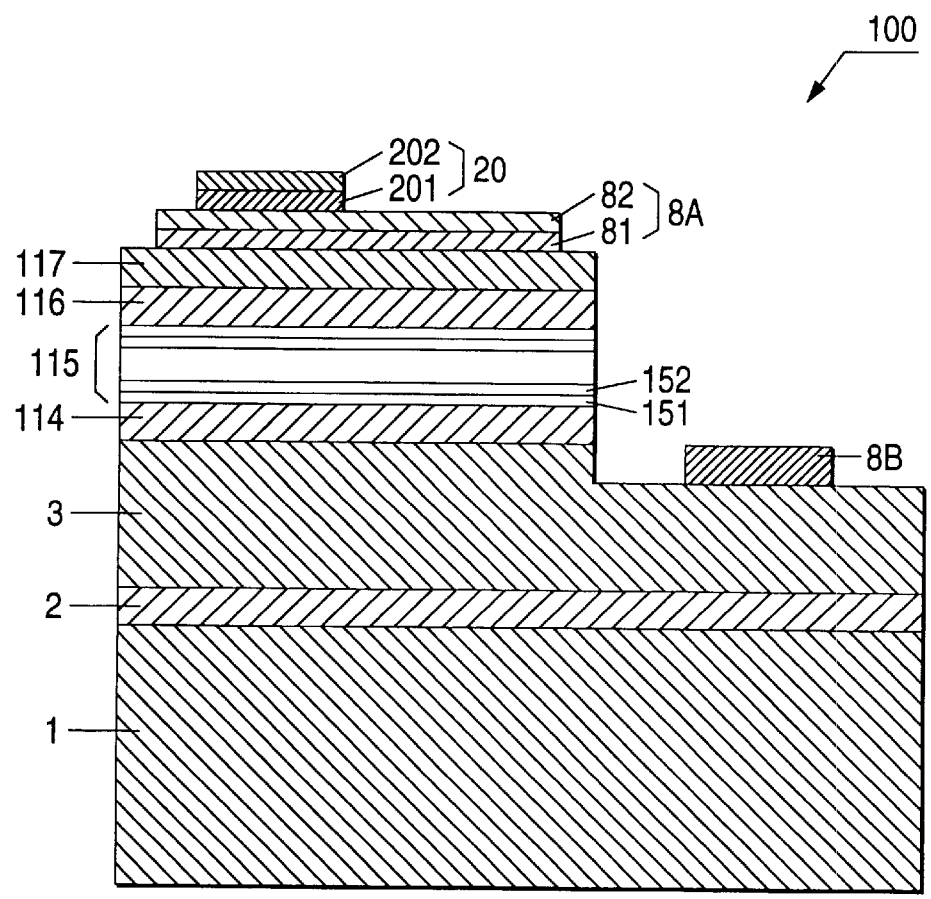
FIG. 10 is a diagrammatic view illustrating the constitution of a GaN related compound semiconductor device according to a fourth embodiment of the present invention.
Figure 11:
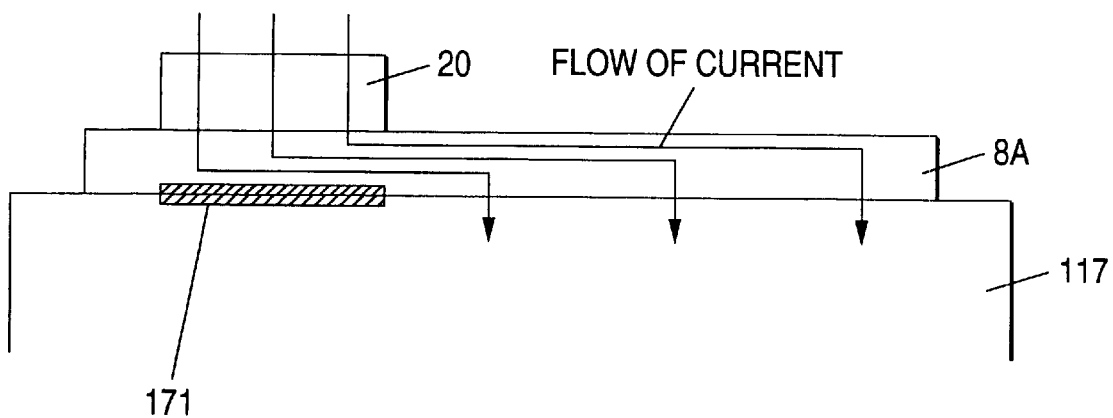
FIG. 11 is a diagrammatic view illustrating the flow of current around electrodes in the GaN related compound semiconductor device according to the fourth embodiment of the present invention.

FIG. 10 is a sectional view diagrammatically illustrating the constitution of a light-emitting device 100 having a GaN related compound semiconductor formed over a sapphire substrate 1. The light-emitting device 100 was produced by MOVPE as in the aforementioned embodiments.

This light-emitting device 100 has the substantially same structure as the third embodiment. However, on a part of the electrode 8A, a pad electrode 20 has been formed comprising a first metal layer 201 about 300 Å thick made of vanadium (V) and a second metal layer 202 having a two-layer structure comprising a cobalt layer about 1,000 Å thick and a gold layer about 1.5 μm thick. The process for forming this electrode pad is as follows.

A vanadium film about 300 Å thick is deposited on a part of this electrode 8A to form a first metal layer 201. On the first metal layer 201 are successively deposited a cobalt film about 1,000 Å thick and a gold film about 1.5 μm-thick to form a second metal layer 202. Thus, the electrode pad 20 is formed.

After the formation of the electrodes 8A, 8B, and pad 20, p-type low resistance is imparted to the contact layer 117 and clad layer 116 and, at the same time, the alloying of the contact layer 117, metal layers 81 and 82, first metal layer 201, and second metal layer 202 was conducted simultaneously with the alloying of the electrode 8B and n⁺ layer 3 by the same process as described in the previous embodiments.

As shown in the embodiment described above, the first metal layer 201 of the electrode pad 20, which layer is bonded to the electrode 8A, is constituted of vanadium, which is reactive with nitrogen. Consequently, in an alloying treatment, the vanadium reacts with GaN of the contact layer 117 to improve the adhesion between the electrode pad 20 and the electrode 8A, whereby the electrode pad 20 can be prevented from peeling off.

Furthermore, as a result of the reaction of vanadium with GaN of the contact layer 117, nitrogen holes generate within the contact layer 117. Since the donor attributable to these holes compensates for an acceptor to result in a reduced hole concentration, a high-resistivity region 171 is formed under the electrode pad 20 around the junction of the contact layer 117 with the electrode 8A, as shown in FIG. 11. Due to the formation of this high-resistivity region 171, current flows from the electrode pad 20 not downward but in lateral directions along the electrode 8A. The electrode pad 20 is a thick part which has no light transmission properties and through which light cannot generally pass. By thus causing the current which has passed through the electrode pad 20 to flow along the electrode 8A, through which light can pass, the electrode 8A has an increased current density and an improved luminance can be obtained.

In the embodiment described above, vanadium was used as the material of the first metal layer 201. However, use of a chromium (Cr) film about 300 Å thick as the first metal layer 201 was also found to be effective, like the vanadium film, in obtaining tenacious adhesion and in causing current to flow from the electrode pad 20 not downward but selectively along the electrode 8A.

Although chromium or vanadium was used for the first metal layer 201 in the above embodiment, the layer 201 may be constituted of at least one of chromium, vanadium, titanium (Ti), niobium (Nb), tantalum (Ta), and zirconium (Zr). Although cobalt and gold were used for the second metal layer 202, this layer may be constituted of at least one of cobalt, nickel, aluminum, and gold. It is also possible to use two or more of these materials to form an electrode pad 20 of a single-layer structure by simultaneous vapor deposition.

The electrode 8A may further contain palladium or a palladium alloy. As long as these materials are used, the electrode 8A may have a single-layer structure or a multi-layer structure comprising three or more layers as the aforementioned embodiments.

In the embodiment described above, the heating for alloying was conducted at a temperature of 550° C. However, temperatures in the range of from 400 to 700° C. are usable.

In the embodiment.described above, the heat treatment was conducted in an $O_2$ gas atmosphere (as described in the first and third embodiments). However, the atmosphere for heat treatment may consist of at least one member selected from $O_2$, $O_3$, CO, $CO_2$, NO, $N_2O$, $NO_2$, and $H_2O$ or a mixed gas containing two or more of these. The atmosphere for heat treatment may also be a mixed gas containing at least one of $O_2$, $O_3$, CO, $CO_2$, NO, $N_2O$, $NO_2$, and $H_2O$ and one or more inert gases, or be a mixed gas containing a mixture of two or more of $O_2$, $O_3$, CO, $CO_2$, NO, $N_2O$, $NO_2$, and $H_2O$ and one or more inert gases. In short, the atmosphere for heat treatment may be any gas containing either oxygen atoms or molecules having oxygen atoms. In the heat treatment, the hydrogen atoms bonded to atoms of a p-type impurity in the contact layer 117 are heated in a gas comprising oxygen and are thereby separated from the p-type impurity atoms. As a result, the contact layer 117 can have lower resistance.

In the embodiment described above, alloying was conducted in an $O_2$ gas atmosphere having a pressure of 3 Pa. However, the pressure of the atmosphere for heat treatment is not particularly limited as long as the GaN related compound semiconductor is not pyrolyzed at the temperature used for the heat treatment. In the case where $O_2$ gas alone is used as a gas comprising oxygen, the gas may be introduced at a pressure higher than the decomposition pressure for the GaN related compound semiconductor. In the case where a mixture of $O_2$ with an inert gas is used, the pressure of the whole mixed gas is regulated to a value higher than the decomposition pressure for the CaN related compound semiconductor. In this case, an $O_2$ gas proportion not smaller than about $10^{-6}$ based on the whole mixed gas is sufficient. For example, when heat treatment was conducted in an atmosphere consisting of $N_2$ gas containing 1% $O_2$ gas and having a partial $O_2$ gas pressure of 100 Pa, the same effects as the above were obtained. There is no particular upper limit on the introduction amount of the gas comprising oxygen from the standpoints of the impartation of p-type low resistance and electrode alloying. Any high pressure is usable as long as production is possible.

As shown above, this embodiment provides the following effects. By forming a current-diffusing electrode combining light transmission properties and ohmic properties on a p-type GaN related compound semiconductor and further forming thereon a electrode pad containing a metal reactive with nitrogen, not only can the electrode pad be prevented from peeling off, but also the current-diffusing electrode can have an increased current density and an improved luminance.

The present invention described above relates to light-emitting diodes having a light-transmitting electrode and an electrode pad. However, the present invention is applicable also to the production of laser diodes (LD), light-receiving devices, and other electronic devices expected to employ GaN related compound semiconductor devices, such as, e.g. , high-temperature devices and power devices.

What is claimed is:

1. A process for producing a p-type GaN related compound semiconductor, comprising:

doping a GaN related compound semiconductor with a p-type impurity; and subjecting the GaN related compound semiconductor to a heat treatment under a low vacuum condition of 10 Torr or lower in a gas comprising at least oxygen.

2. A process for producing a GaN related compound semiconductor device comprising:

doping a GaN related compound semiconductor layer with a p-type impurity;

forming an electrode on the GaN related compound semiconductor layer; and subjecting the GaN related compound semiconductor layer having the electrode formed thereon to a heat treatment under a low vacuum condition of 10 Torr or lower in a gas comprising at least oxygen.

3. A process for producing a GaN related compound semiconductor device comprising:

doping a first GaN related compound semiconductor layer with a p-type impurity;

doping a second GaN related compound semiconductor layer with an n-type impurity;

forming a first electrode on the first GaN related compound semiconductor layer;

forming a second electrode on the second GaN related compound semiconductor layer; and subjecting the resultant structure including the first and second GaN related compound semiconductor layers and the first and second electrodes to a heat treatment under a low vacuum condition of 10 Torr or lower in a gas comprising at least oxygen.

4. The process for producing a p-type GaN related compound semiconductor acording to claim 1, wherein the gas comprising oxygen comprises at least one member selected from the group consisting of $O_2$, $O_3$, CO, $CO_2$, NO, $N_2O$, $NO_2$, and $H_2O$.

5. The process for producing a p-type GaN related compound semiconductor acording to claim 4, wherein the gas comprising oxygen further comprises inert gas.

6. The process for producing a GaN related compound semiconductor device acording to claim 2, wherein the gas comprising oxygen comprises at least one member selected from the group consisting of $O_2$, $O_3$, CO, $CO_2$, NO, $N_2O$, $NO_2$, and $H_2O$.

7. The process for producing a GaN related compound semiconductor device acording to claim 6, wherein the gas comprising oxygen further comprises inert gas.

8. The process for producing a GaN related compound semiconductor device acording to claim 3, wherein the gas comprising oxygen comprises at least one member selected from the group consisting of $O_2$, $O_3$, CO, $CO_2$, NO, $N_2O$, $NO_2$, and $H_2O$.

9. The process for producing a GaN related compound semiconductor device acording to claim 8, wherein the gas comprising oxygen further comprises inert gas.

10. The process for producing a p-type GaN related compound semiconductor according to claim 1, wherein the heat treatment is conducted at a temperature not lower than 400° C.

11. The process for producing a GaN related compound semiconductor device acording to claim 2, wherein the heat treatment is conducted at a temperature not lower than 400° C.

12. The process for producing a GaN related compound semiconductor device acording to claim 3, wherein the heat treatment is conducted at a temperature not lower than 400° C.

* * * * *